US012031775B2

(12) United States Patent
    May

(10) Patent No.: US 12,031,775 B2
(45) Date of Patent: Jul. 9, 2024

(54) MODULAR GUN ASSEMBLY FOR MELT FURNACES

(71) Applicant: Titanium Metals Corporation, Henderson, NV (US)

(72) Inventor: David M. May, Robesonia, PA (US)

(73) Assignee: Titanium Metals Corporation, Henderson, NV (US)

( * ) Notice: Subject to any disclaimer, the term of this patent is extended or adjusted under 35 U.S.C. 154(b) by 700 days.

(21) Appl. No.: 17/122,331

(22) Filed: Dec. 15, 2020

(65) Prior Publication Data

US 2021/0180866 A1    Jun. 17, 2021

Related U.S. Application Data

(60) Provisional application No. 62/948,997, filed on Dec. 17, 2019.

(51) Int. Cl.
    *F27B 5/14*     (2006.01)
    *C22B 9/22*     (2006.01)
    *F27B 5/04*     (2006.01)

(52) U.S. Cl.
    CPC ............... *F27B 5/14* (2013.01); *C22B 9/228* (2013.01); *F27B 5/04* (2013.01)

(58) Field of Classification Search
    None
    See application file for complete search history.

(56) References Cited

U.S. PATENT DOCUMENTS

| 3,337,676 A | | 8/1967 | Yih et al. | |
| 3,486,064 A | * | 12/1969 | Stauffer | H01J 17/26 |
| 4,163,889 A | * | 8/1979 | Schoenmakers | B23K 15/00 |
| | | | | 219/121 |
| 7,345,257 B2 | * | 3/2008 | Yamazaki et al. | B23K 26/04 |
| | | | | 219/121.6 |

(Continued)

FOREIGN PATENT DOCUMENTS

| CN | 108158418 A | * | 6/2018 | | A47J 36/10 |
| DE | 102013007220 A1 | * | 10/2014 | | H01J 37/065 |

(Continued)

OTHER PUBLICATIONS

Machine translation of DE 102013007220 A1 performed on Jun. 13, 2023, Foll et al. (Year: 2014).*

(Continued)

*Primary Examiner* — Dana Ross
*Assistant Examiner* — Kevin Guanhua Wen
(74) *Attorney, Agent, or Firm* — Burris Law, PLLC (57) ABSTRACT

An electron beam (EB) gun assembly for an EB furnace is provided. The EB gun assembly includes an EB gun-frame assembly including a skeleton frame and at least one EB gun mounted to the skeleton frame, and the EB gun-frame assembly is configured to rigidly mount onto a first EB chamber lid and melt material in a first EB chamber and be removed and rigidly mount onto a second EB chamber lid and melt material in a second EB chamber. In some forms, the EB gun assembly includes at least one mounting frame and the at least one EB gun is mounted to the at least one mounting frame and the at least one mounting frame is mounted to the skeleton frame.

20 Claims, 7 Drawing Sheets

(56) References Cited

U.S. PATENT DOCUMENTS

| | | | |
|---|---|---|---|
| 7,697,222 B2* | 4/2010 | Shibazaki | G02B 7/02 359/822 |
| 8,878,422 B2* | 11/2014 | Mattausch et al. | H01J 37/075 313/33 |
| 2010/0012860 A1* | 1/2010 | Vokurka | B01J 19/08 250/492.3 |
| 2015/0021495 A1* | 1/2015 | Saito et al. | H01J 37/20 250/453.11 |

FOREIGN PATENT DOCUMENTS

| | | |
|---|---|---|
| DE | 102017110651 | 11/2018 |
| GB | 995005 | 6/1965 |

OTHER PUBLICATIONS

Machine translation of CN 108158418 A performed on Jun. 15, 2023, Gu et al. (Year: 2018).*

International Search Report for International Application PCT/US2020065060, dated Jun. 14, 2021.

* cited by examiner

MODULAR GUN ASSEMBLY FOR MELT FURNACES

CROSS-REFERENCE TO RELATED APPLICATIONS

This application claims priority to and the benefit of provisional application 62/948,997 filed on Dec. 17, 2019. The disclosure of the above application is incorporated herein by reference.

FIELD

The present disclosure relates to electron beam furnaces, and particularly to electron beam gun assemblies for electron beam furnaces.

BACKGROUND

The statements in this section merely provide background information related to the present disclosure and may not constitute prior art.

An electron beam (EB) furnace uses one or more electron beams to melt material (e.g., scrap or virgin alloy material) and produce an ingot. Such a furnace typically has one or more EB guns mounted on or to apertures of a chamber lid attached to a chamber such that electron beam(s) generated by the EB gun(s) propagate through the apertures and melt material contained in the chamber during a melting campaign. One issue with EB furnace melting efficiency is downtime required to clean the chamber and/or chamber lid before another melting campaign can begin.

The present disclosure addresses issues related to downtime in EB furnace melting, among other issues related to melting and forming of alloy ingots.

SUMMARY

In one form of the present disclosure, an electron beam (EB) gun assembly for an EB furnace is provided. The EB gun assembly comprises an EB gun-frame assembly comprising a skeleton frame and at least one EB gun mounted to the skeleton frame, wherein the EB gun-frame assembly is configured to rigidly mount onto a first EB chamber lid and melt material in a first EB chamber and be removed and rigidly mount onto a second EB chamber lid and melt material in a second EB chamber. In some variations, the skeleton frame comprises at least one EB gun opening and the at least one EB gun extends through the at least one EB gun opening.

In at least one variation of the present disclosure, the EB gun assembly includes at least one mounting frame, the at least one EB gun is mounted to the at least one mounting frame and the at least one mounting frame is mounted to the skeleton frame. In some variations, the mounting frame comprises a nozzle opening and the at least one EB gun comprises a nozzle extending through the nozzle opening. In at least one variation, the mounting frame comprises a top plate having the nozzle opening and a floating plate movably attached to the top plate, and the nozzle of the at least one EB gun is mounted to the floating plate such that a position of the nozzle is movable after the EB gun-frame assembly is rigidly mounted to the first and second EB chamber lids.

In some variations a collar is rigidly attached to the nozzle of the EB gun and is movably attached to the top plate of the mounting frame such that the position of the nozzle is movable after the EB gun-frame assembly is rigidly mounted to the first and second EB chamber lids. In at least one variation a plurality of biasing members is positioned between the collar and the top plate such that the collar is movable after the EB gun-frame assembly is rigidly mounted to the first and second EB chamber lids. Also a first alignment guide configured to receive a second alignment pin extending from at least one of the first EB furnace lid and the second EB furnace lid can be included such that the at least one EB gun is aligned with a lid gun aperture.

In some variations of the present disclosure, the at least one EB gun is a plurality of EB guns mounted to the skeleton frame. In such variations the EB gun assembly has a plurality of mounting frames, each of the plurality of EB guns is mounted to a mounting frame and each of the plurality of mounting frames is mounted to the skeleton frame. In at least one variation each of the plurality of mounting frames has a nozzle opening and each of the plurality of EB guns has a nozzle extending through the nozzle opening of a mounting frame. Each of the plurality of mounting frames includes a top plate with a nozzle opening and a floating plate movably attached to the top plate. The nozzle of each of the plurality of EB guns is mounted to the floating plate of a mounting frame such that a position of the nozzle of each of the plurality of EB guns is movable after the EB gun-frame assembly is rigidly mounted to the first and second EB chamber lids. In some variations, each of the plurality of mounting frames includes a collar rigidly attached to the nozzle of the EB gun and movably attached to the top plate of the mounting frame such that the position of the nozzle of each of the plurality of EB guns is movable after the EB gun-frame assembly is rigidly mounted to the first and second EB chamber lids. In at least one variation a plurality of biasing members is positioned between each collar and a top plate such that each collar is movable after the EB gun-frame assembly is rigidly mounted to the first and second EB chamber lids.

In another form of the present disclosure, an electron beam (EB) furnace assembly is provided. The EB furnace assembly comprises a first EB furnace comprising a first EB chamber and a first EB chamber lid having a first set of EB gun apertures, a second EB furnace comprising a second EB chamber and a second EB chamber lid having a second set of EB gun apertures, and an EB gun-frame assembly. The EB gun-frame assembly comprises a skeleton frame and a plurality of EB guns mounted to the skeleton frame. The EB gun-frame assembly is configured to rigidly mount onto the first EB chamber lid with the plurality of EB guns mounted onto the first set of EB gun apertures and rigidly mount onto the second EB chamber lid with the plurality of EB guns mounted onto the second set of EB gun apertures such that the EB gun-frame assembly is interchangeable with the first and second EB chamber lids.

In some variations of the present disclosure, the EB gun assembly includes a plurality of mounting frames, the plurality of EB guns are securely mounted to the plurality of mounting frames, and the plurality of mounting frames are securely mounted to the skeleton frame. In at least one variation, each of the plurality of mounting frames has a top plate and a floating plate movable mounted to the top plate. Also, each of the plurality of EB guns is rigidly mounted to a floating plate such that the nozzle of the each of the plurality of EB guns is mounted to the floating plate of a mounting frame such that a position of each of the plurality of EB guns is movable after the EB gun-frame assembly is rigidly mounted to the first and second EB chamber lids. In some variations each of the plurality of mounting frames includes a collar rigidly attached to a nozzle of an EB gun and the nozzle is movably attached to the top plate of the mounting frame such that the position of the nozzle of each of the plurality of EB guns is movable after the EB gun-frame assembly is rigidly mounted to the first and second EB chamber lids.

In yet another form of the present disclosure, a method of melting material with an electron gun (EB) furnace assembly is provided. The method includes securely mounting an EB gun-frame assembly to a first EB chamber lid. The EB gun-frame assembly includes a skeleton frame and a plurality of EB guns securely mounted to the skeleton frame. The first EB chamber lid comprises a first set of EB gun apertures and the plurality of EB guns are mounted onto the first set of EB gun apertures. Material is melted in a first EB chamber using the plurality of EB guns when the first EB chamber lid and the EB gun-frame assembly are securely mounted to the first EB chamber. In some variations, the method includes removing the EB gun-frame assembly from the first EB chamber lid and securely mounting the EB gun-frame assembly to a second EB chamber lid that has a second set of EB gun apertures. The plurality of EB guns are mounted onto the second set of EB gun apertures and material is melted in a second EB chamber using the plurality of EB guns when the second EB chamber lid and the EB gun-frame assembly are securely mounted to the second EB chamber.

In some variations of the present disclosure the EB gun-frame assembly includes a plurality of mounting frames securely mounted to the skeleton frame and the plurality of EB guns securely mounted to the plurality of mounting frames. In at least one variation each of the plurality of mounting frames has a top plate and a floating plate movable mounted to the top plate, and each of the plurality of EB guns is rigidly mounted to a floating plate such that a position of each of the plurality of EB guns is movable after the EB gun-frame assembly is rigidly mounted to the first and second EB chamber lids. In some variations the method includes moving a position of at least one of the plurality of EB guns and securely mounting the at least one of the plurality of EB guns onto an EB gun aperture on the first EB chamber lid after the EB gun-frame assembly is rigidly mounted to the first EB chamber lid. In at least one variation a position of at least one of the plurality of EB guns is moved and securely mounted onto an EB gun aperture on the second EB chamber lid after the EB gun-frame assembly is rigidly mounted to the second EB chamber lid.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Figure 1:
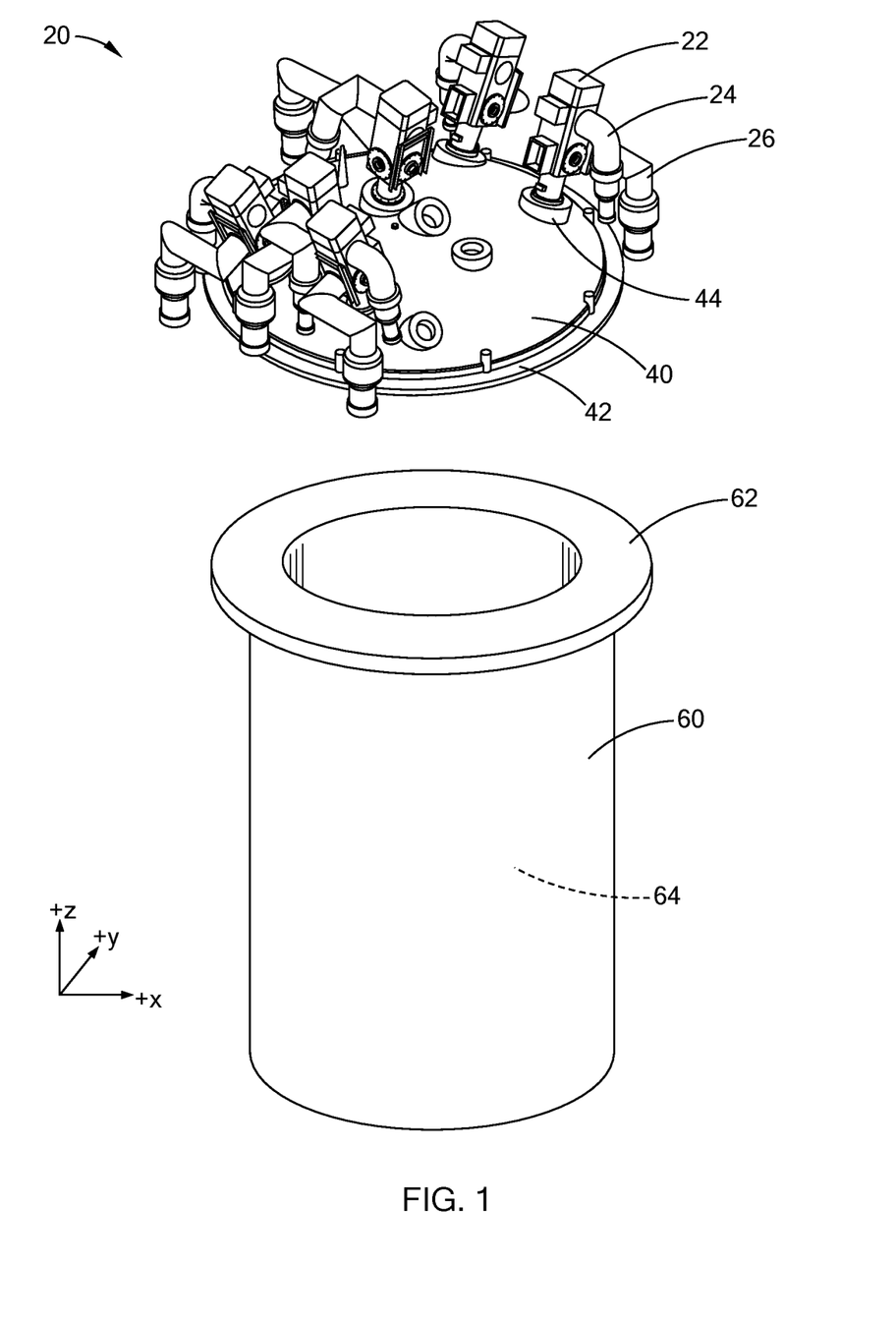
FIG. 1 is a perspective view of chamber and a plurality of electron beam (EB) guns mounted on a chamber lid.

Referring to FIG. 1, an electron beam (EB) gun and lid assembly 20 is shown. The EB gun and lid assembly 20 comprises at least one EB gun 22 (also referred to herein simply as "EB guns") and a lid 40. The EB guns 22 each have a pair of EB gun ducts 24, 26 through which air can be withdrawn and exhaust gas can flow during operation of the EB guns 22 as described below. The EB guns 22 are attached and mounted to the lid 40 at EB gun apertures 44, and the EB gun and lid assembly 20 couples to a chamber 60 with an interior 64. In some variations of the present disclosure, clamps (not shown) are used to fasten and secure a lid flange 42 of the lid 40 to a chamber flange 62 of the chamber 60 such that an air or vacuum tight seal is provided between the lid 40 and chamber 60. In some variations, one or more of the EB guns 22 are mounted to the lid 40 before the lid 40 is attached or coupled to the chamber 60, while in other variations one or more of the EB guns 22 are mounted to the lid 40 after the lid 40 is attached or coupled to the chamber 60.

Mounting the EB guns 22 to the EB gun apertures 44, and coupling the EB gun and lid assembly 20 to the chamber 60, aligns the EB guns 22 at desired angles relative to the interior 64. And during operation of the EB guns 22, a vacuum is pulled on the EB guns 22 (i.e., housings that contain the EB guns 22 (not labeled)) through the EB gun ducts 24, 26 and electron beams from the EB guns 22 propagate through EB gun apertures 44 and into chamber 60. It should be understood that air is also withdrawn from the chamber 60 using vacuum pumps (not shown). The electron beams heat and melt a campaign of one or more batches of material to form liquid metal (not shown) in the interior 64 of the chamber 60 during a melting campaign and the liquid metal is allowed to cool within the chamber to form an ingot (not shown) before the lid 40 with the attached EB guns 22 is removed.

It should be understood that using such an EB gun and lid assembly 20 provides a clean and energy efficient process for producing commercial ingots, e.g., commercial titanium alloy ingots. However, it is desired to clean and/or refurbish the chamber 60 and the lid 40 before proceeding with a subsequent melting campaign, and such cleaning and/or refurbishing takes or occupies time during which use of the EB gun and lid assembly 20 for melting is prohibited. That is, the EB gun and lid assembly 20 cannot be used to melt material when the chamber 60 and the lid 40 are being cleaned and/or refurbished.

Figure 2:
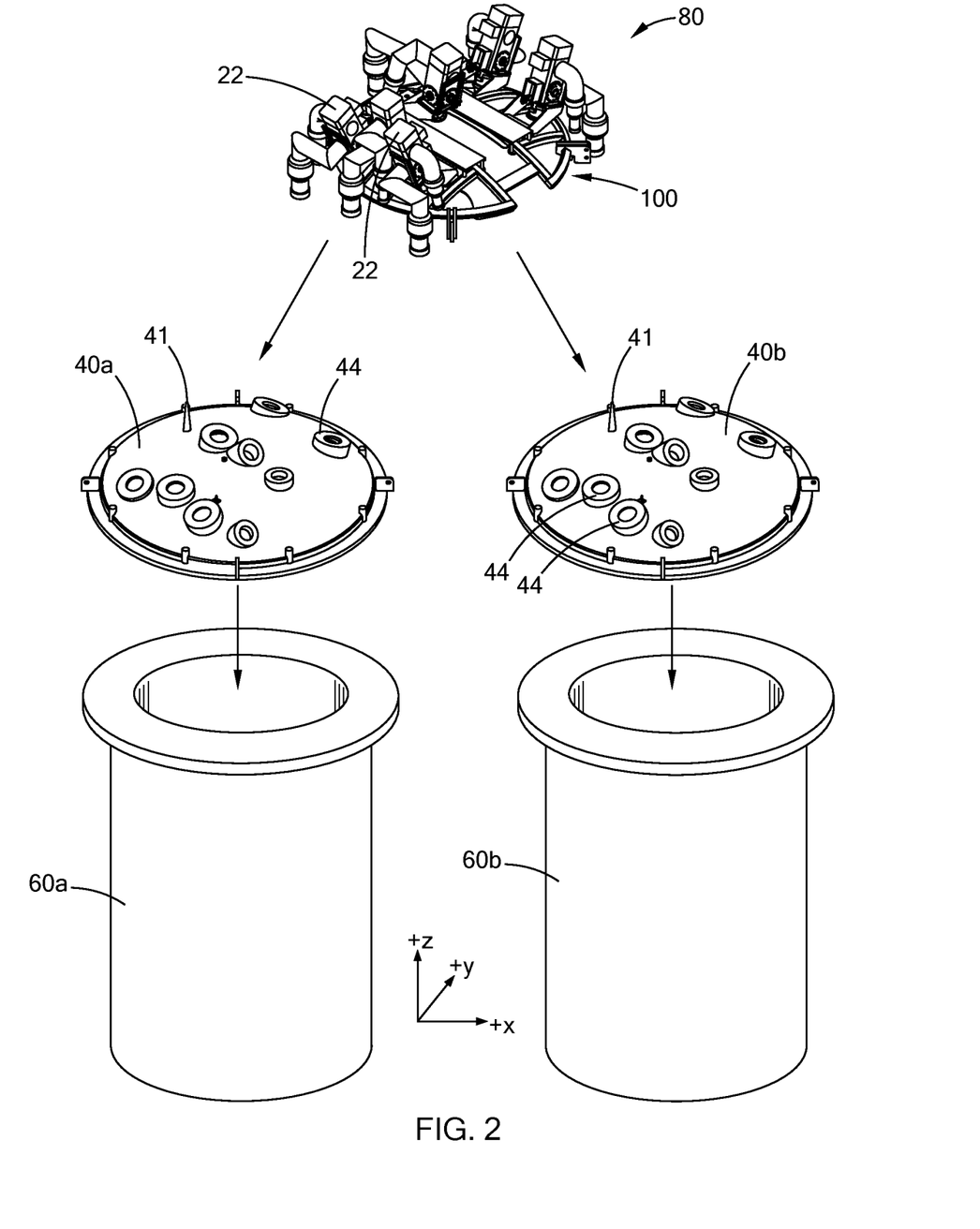
FIG. 2 is a perspective view of an EB gun assembly configured to attach or mount to a first chamber and a second chamber lid according to the teachings of the present disclosure.

Referring now to FIG. 2, an EB gun assembly 80 according to the teachings of the present disclosure is shown. The EB gun assembly 80 comprises a skeleton frame 100 and EB guns 22 with mounted to the skeleton frame 100. In some variations, each of the EB guns 22 has the pair of EB ducts 24, 26. As depicted in FIG. 2, the skeleton frame 100 is configured to couple to a first lid 40a and a second lid 40b (collectively referred to herein as "lids 40a, 40b"), and the first lid 40a is configured to couple to a first chamber 60a and the second lid 40b is configured to couple to a second chamber 60b. In some variations the first lid 40a is also configured to couple to the second chamber 60b and the second lid 40b is configured to couple to the first chamber 60a. That is, the lids 40a, 40b are interchangeable with the first chamber 60a and the second chamber 60b (collectively referred to herein as "chambers 60a, 60b"). In at least one variation, one or both of the lids 40a, 40b can include a first alignment guide 41 that assists in alignment of the EB gun assembly 80 onto the lids 40a, 40b as described in more detail below. It should be understood that such a configuration allows or enables the EB gun assembly 80 to be removed from the first lid 40a, e.g., after first melting campaign, and be attached to the second lid 40b for a second melting campaign in the second chamber 60b. Such a configuration also allows or enables the first lid 40a to be cleaned and/or refurbished for another melting campaign in the first chamber 60a while or during the second melting campaign in the second chamber 60b.

Figure 3:
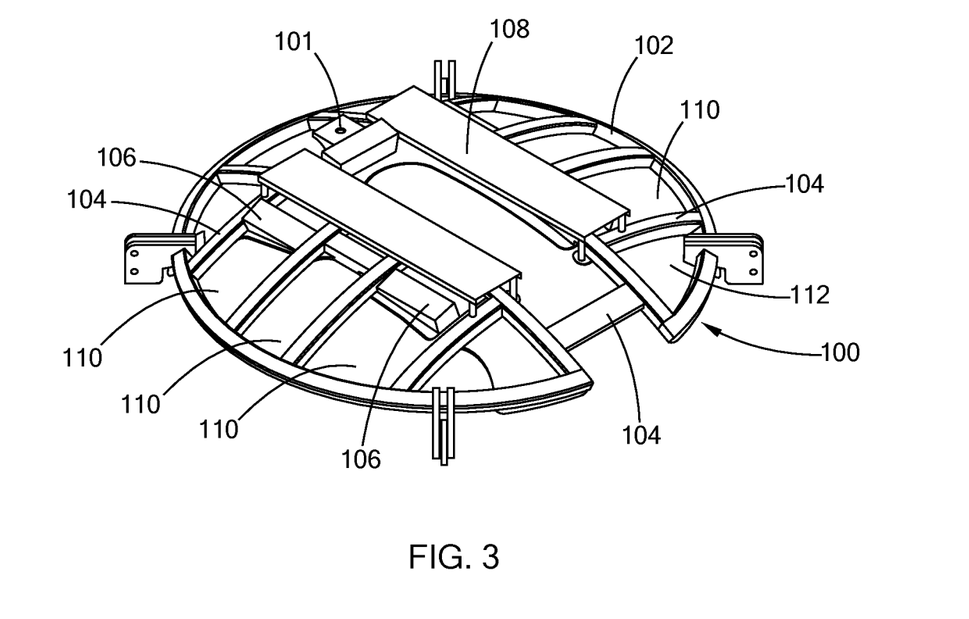
FIG. 3 is a perspective view of a skeleton frame for the EB gun assembly in FIG. 2.

Referring now to FIG. 3, the skeleton frame 100 is shown and includes an outer ring 102, a plurality of cross members 104, and at least one mounting member 106. The outer ring 102, the plurality of cross members 104, and the at least one mounting member 106 are rigidly attached to each other to form the skeleton frame 100 and to define a plurality of openings 110. The openings 110 reduce the weight of the skeleton frame 100 and permit visual inspection, observation, and access to the lids 40a, 40b. In some variations a deck 108 is included and attached to at least one cross member 104. The deck 108 provides a platform for an individual to walk on and work from during installation or mounting of the EB guns 22 to the skeleton frame 100, mounting of the EB gun assembly 80 to one of the lids 40a, 40b, and/or melting of material in the chambers 60a, 60b. In at least one variation a cover plate 112, with or without a second alignment guide 101, is included and extends between and is attached to one or more of the cross members 104.

Figure 4:
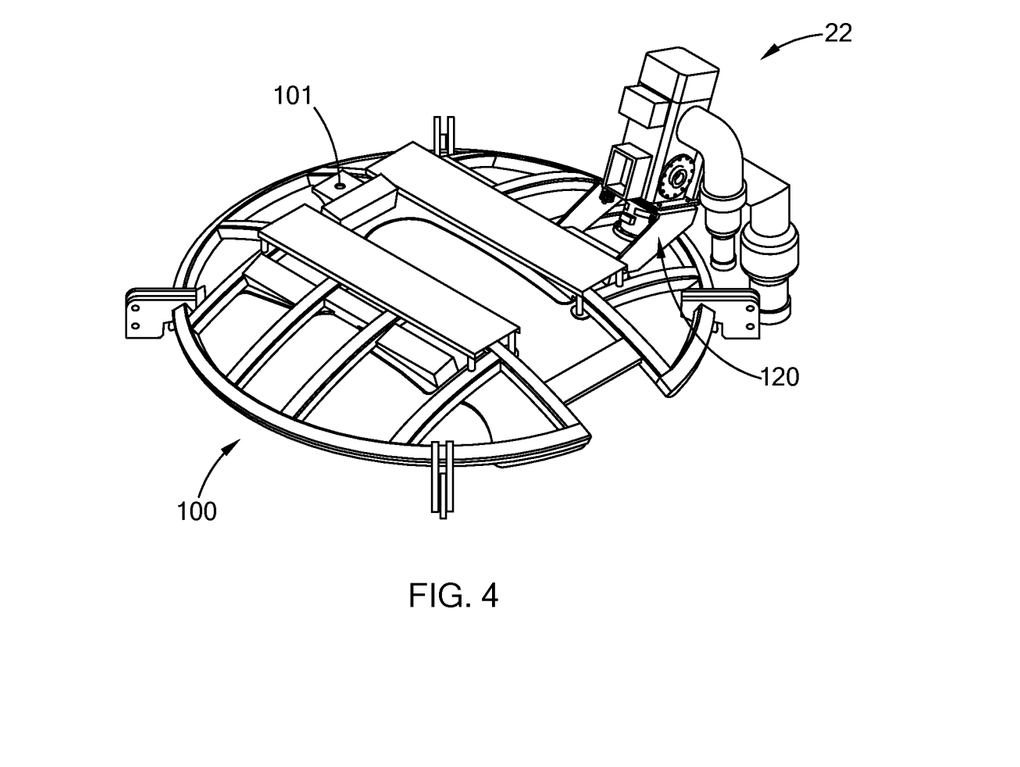
FIG. 4 is the skeleton frame in FIG. 3 with an EB gun mounted to the skeleton frame according to the teachings of the present disclosure.

Referring to FIG. 4, in some variations the EB gun assembly 80 includes a mounting frame 120 configured to receive and hold one of the EB guns 22. Particularly, and as discussed in greater detail below, the mounting frame 120 is rigidly attached to the skeleton frame 100 and can assist in aligning and rigidly mounting an EB gun 22 to an EG gun aperture 44. In some variations of the present disclosure, the skeleton frame 100 also couples to and supports at least one of the EB ducts 24, 26.

Figure 5A:
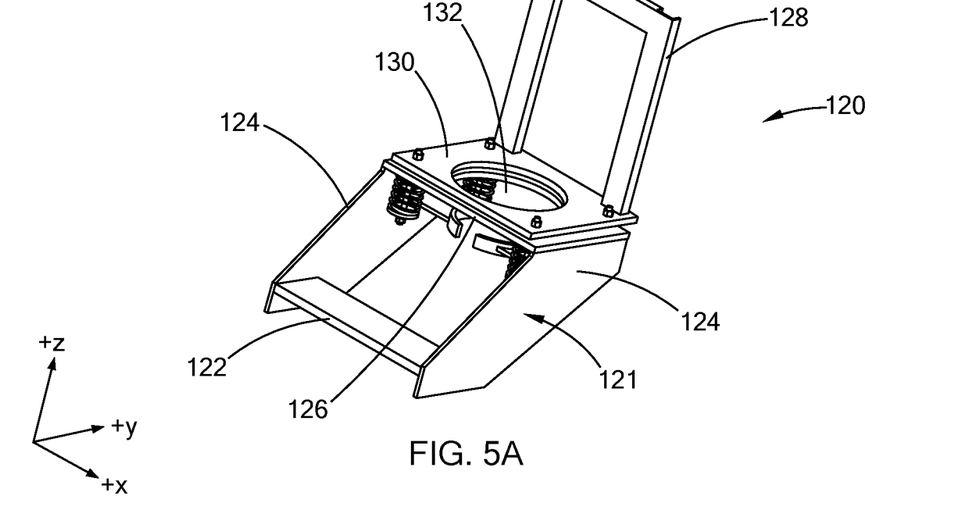
FIG. 5A is a perspective view of a mounting frame for the EB gun assembly according to the teachings of the present disclosure.
Figure 5B:
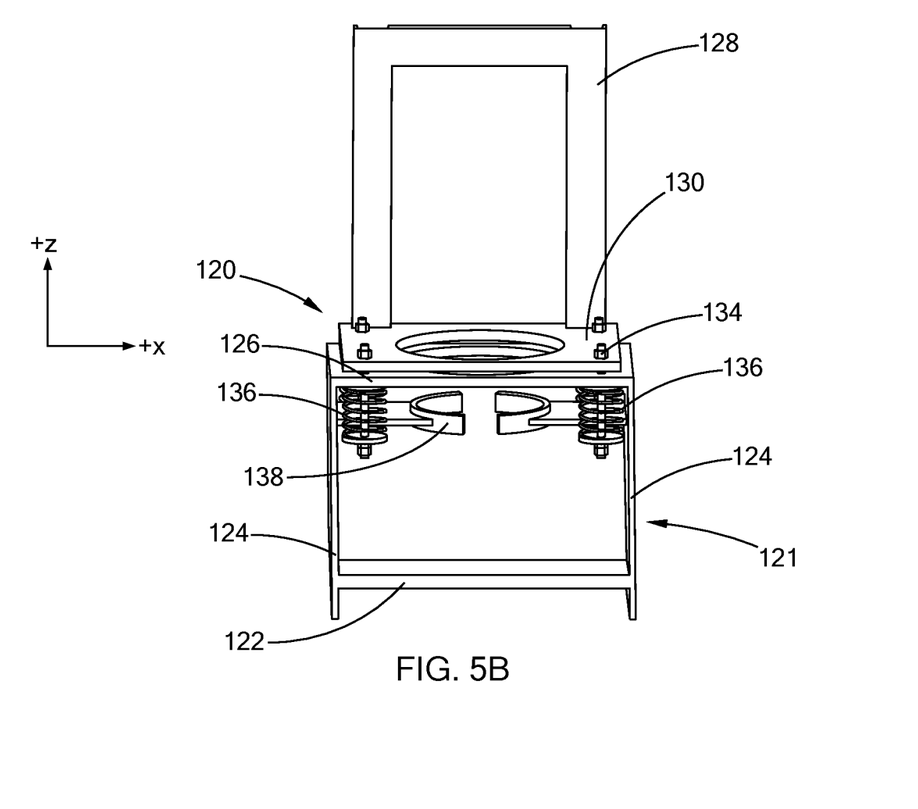
FIG. 5B is a front view of the mounting frame in FIG. 5A.

Referring to FIGS. 5A and 5B, in some variations the mounting frame 120 includes a mounting plate 122, a pair of side plates 124, and a top plate 126. The mounting plate 122, pair of side plates 124, and top plate 126 form a frame 121 configured to support an EB gun 22. Also, the mounting plate 122 is configured to be rigidly attached to the mounting member 106 (FIG. 3) of the skeleton frame 100 and the top plate 126 and floating plate 130 each have a gun aperture 132.

In some variations of the present disclosure, a floating plate 130 is included and coupled to the top plate 126 with a plurality of rods 134 and floating springs 136. For example, the plurality of rods 134 have an upper end (not labeled, +z direction) rigidly attached to the floating plate 130 and a plurality of floating springs 136 disposed between lower ends (not labeled, −z direction) of the rods 134 and the top plate 126 as shown in FIG. 5B. Accordingly, the floating plate 130 has limited and biased movement relative to the top plate 126 and the frame 121. That is, the rods 134 translate through the top plate 126, and with the floating springs 136 disposed between lower ends of the rods 134 and the top plate 126, the floating plate 130 is configured to move up/down (+/−z direction) and tilt (about z axis) when the mounting frame 120 is rigidly attached to the skeleton frame 100.

In some variations, a collar 138 is included and coupled to the floating plate 130 such that both the floating plate 130 and the collar have limited and biased movement relative to the top plate 126. It should be understood that the rods 134 can be threaded members and that commercially available fasteners (pins, nuts, washers, among others) affix the rods 134 to the floating springs 136 and floating plate 130.

In at least one variation, the mounting frame 120 includes a brace 128 coupled to either the top plate 126 or the floating plate 130. In variations where the brace 128 is coupled to top plate 126, the brace 128 can be slidably coupled to and/or translate through the floating plate 130. In the alternative, the top plate 126 can extend beyond (+y direction) the floating plate 130 such that the brace 128 is coupled to the top plate 126 but not the floating plate 130. In variations where the brace 128 is coupled to the floating plate 130, the brace 128 moves with the floating plate 130 and has limited movement relative to the top plate 126.

Figure 6:
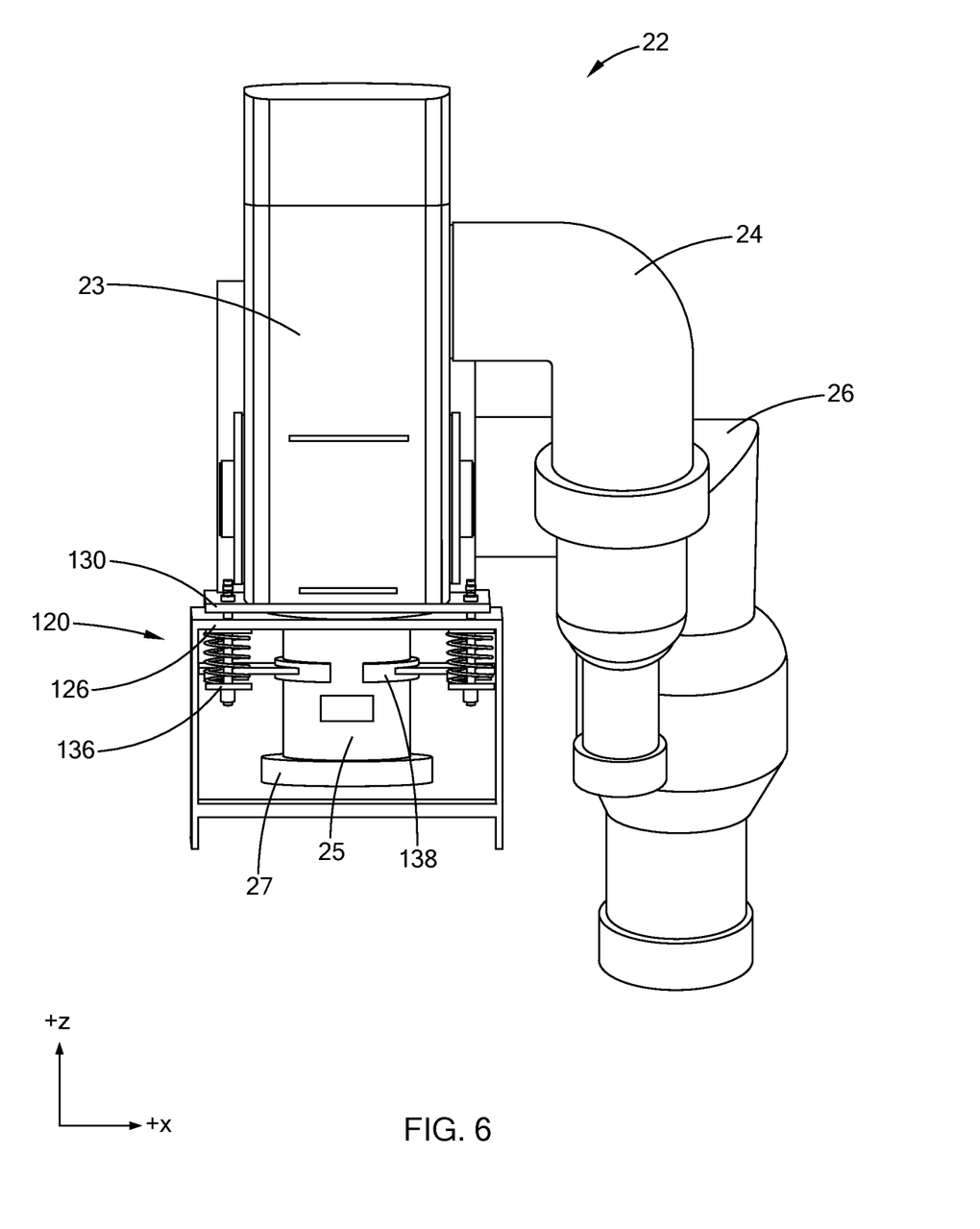
FIG. 6 is front view of the mounting frame ion FIG. 5B with an EB gun mounted to the mounting frame.

Referring to FIG. 6, an EB gun 22 mounted to the mounting frame 120 is shown. The EB gun 22 includes a gun chamber 23 positioned on the floating plate 130 and a gun nozzle 25 with a mounting flange 27 disposed within the gun apertures 132 (FIG. 5A) of the top plate 126 and the floating plate 130. In some variations a bottom surface (not labeled, −z direction) of the gun chamber 23 is rigidly attached to the floating plate 130 and/or the collar 138 is rigidly attached to the gun nozzle 25 such that the gun nozzle 25 has limited movement relative to the mounting frame 120. Accordingly, when the mounting frame 120 is rigidly attached to the skeleton frame 100, the gun nozzle 25 has limited movement relative to the skeleton frame 100, and when the skeleton frame 100 is rigidly attached to the lids 40a, 40b, the gun nozzle 23 has limited movement relative to the lids 40a, 40b and limited movement relative to an EB gun aperture 44. Such limited movement by the gun nozzle 25 assists and enhances alignment and attachment of the gun nozzle 25 to a particular EB gun aperture 44.

Figure 7:
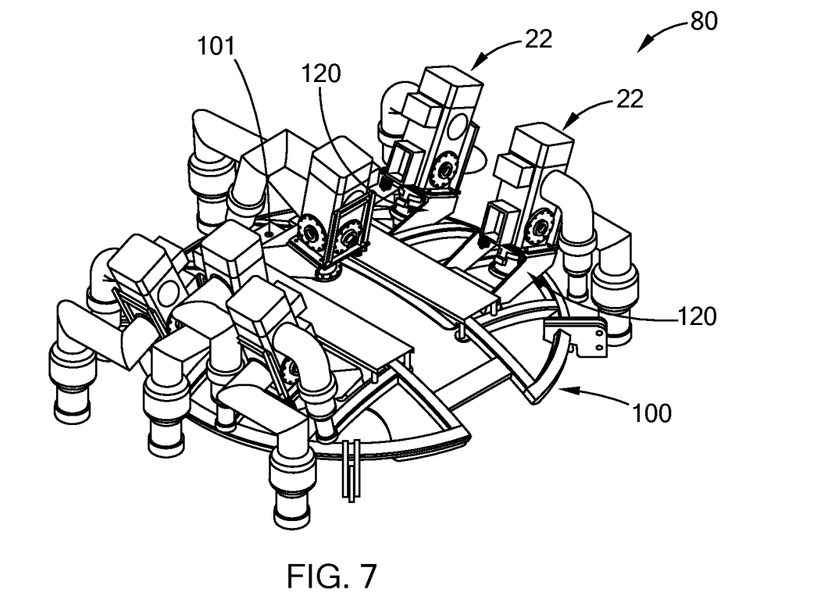
FIG. 7 is an enlarged view of the EB gun assembly in FIG. 2.

Referring to FIG. 7 the EB gun assembly 80 with the plurality of EB guns 22 mounted to the skeleton frame 100 via a plurality frames 120 is shown. It should be understood that each of the mounting frames 120 includes a floating plate 130 movably attached to a top plate 126 as described above such that limited movement is provided to each of the gun nozzles 25 during alignment and attachment of the gun nozzles 25 to respective EB gun apertures 44.

Figure 8:
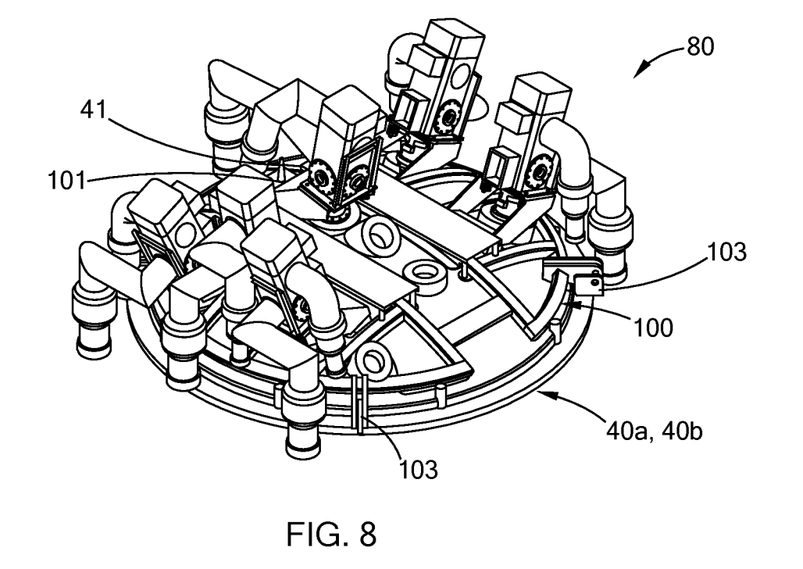
FIG. 8 is the EB gun assembly in FIG. 7 mounted to a chamber lid according to the teachings of the present disclosure.

Referring to FIG. 8, the EB gun assembly 80 rigidly attached to the first lid 40a or second lid 40b is shown. Particularly, the skeleton frame 100 is rigidly attached to the first lid 40a or second lid 40b with a plurality of clamps 103 and each of the EB guns 22 is rigidly attached to a respective EB gun apertures 44. In at least one variation, the mounting flange 27 of each gun nozzle 25 is bolted (not shown) to a respective gun aperture 44. It should be understood that attaching each of the EB guns 22 to the EB gun apertures 44 is assisted and enhanced by the mounting frame 120. For example, in some variations each of the EB guns 22 is mounted to a mounting frame 120 when the EB gun assembly 80 is moved into position and mounted to the first lid 40a or second lid 40b. In at least one variation, the first alignment guide 41 and the second alignment guide 101 assist in positioning the skeleton frame 100 on the lid 40a or second lid 40b. After the skeleton frame 100 is mounted to the first lid 40, each of the gun nozzles 25 is aligned with a respective EB gun aperture 44. Alignment of the gun nozzles 25 with the EB gun apertures 44 is assisted by the limited movement provided by the floating plate 130 relative to the top plate 126 and after each gun nozzle 25 is properly aligned, it is rigidly attached to a EB gun aperture 44 via the mounting flange 27. After the EB guns 22 are rigidly attached to the EB gun apertures 44, a vacuum is pulled on the first chamber 60a (i.e., air is evacuated from the first chamber 60a) and EB melting of material within the first chamber 60a begins (e.g., a first melt campaign is executed or performed). It should be understood that after the first melt campaign the EB gun assembly 80 rigidly is removed from the first lid 40a and the attached to the second lid 40b as described above with respect to the first lid 40a such that a second melt campaign within the second chamber 60b can proceed while the first lid 40a and the first chamber 60a are cleaned and/or refurbished. In addition, this cycle of attaching the EB gun assembly to a separate lid and executing a melt campaign in a separate chamber during cleaning and/or refurbishing or a previously used lid and chamber is repeated over and over such that productivity is enhanced and costs are reduced.

Figure 9:
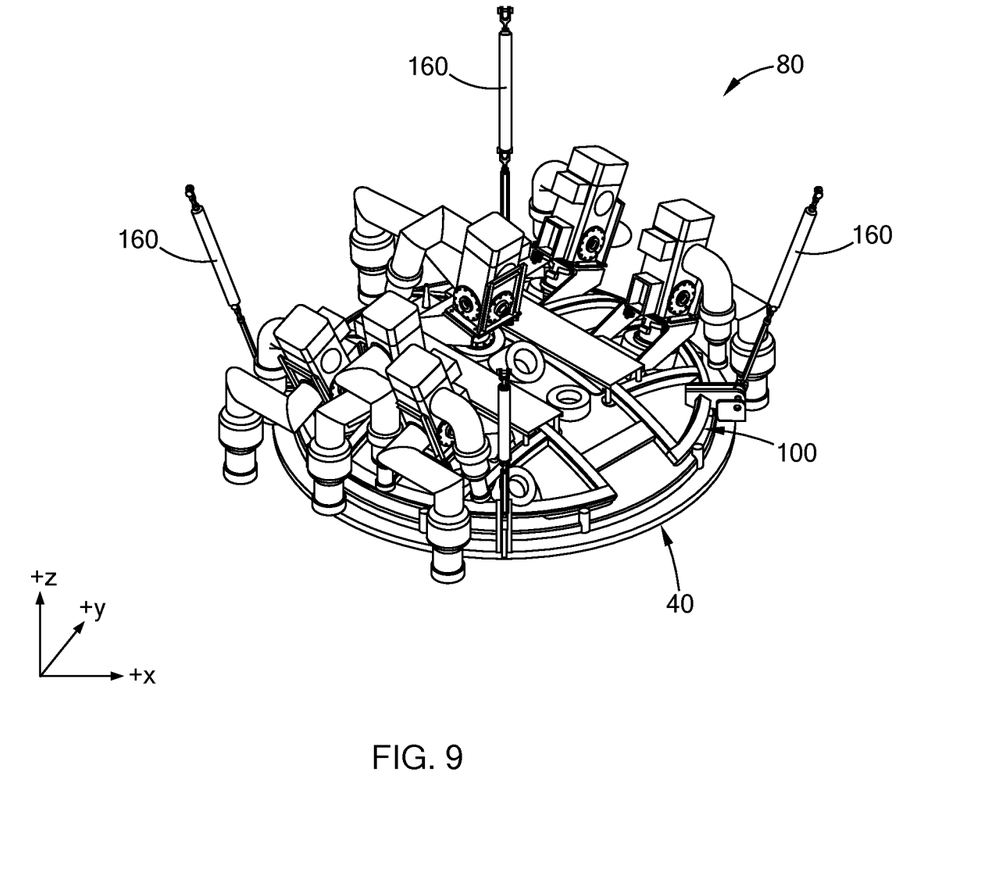
FIG. 9 is the EB gun assembly and chamber lid in FIG. 8 hanging from a support according to the teachings of the present disclosure.

Referring now to FIG. 9, hanging of the EB gun assembly 80 from a support (not shown) using hangers 160 is shown. The support can include a support structure such as a ceiling, crane, frame, platform, rail, and wall, among others. The hangers 160 can include cables, chains, rods, struts, wire, or other appropriate fastening and fixturing assembles. In the alternative, or in addition to, the first lid 40a, second lid 40b, skeleton frame 100 and/or hangers 160 is supported by wheels (not shown). The wheels are supported by rails which enable the lids 40a, 40b and/or skeleton frame 100 to move between chambers, lids, and outside of the furnace station.

It should be understood from the teachings of the present disclosure that an EB gun assembly that reduces downtime for one or more EB guns is provided. The EB gun assembly includes a skeleton frame configured for the one or more EB guns to be securely attached to and yet provide limited movement to the one or more EB guns for alignment of EB gun apertures with a chamber lid. The EB gun assembly can be installed on and/or removed from a chamber lid in a time efficient manner. In addition, when a pair of chambers and a pair chamber lids are included, the EB gun assembly provides a melting campaign to proceed in one of the chambers while the other chamber and chamber lid are being cleaned or refurbished. The use of two chambers, two chamber lids, a skeleton frame, and the EB gun assembly according to the teachings of the present disclosure reduces changeover time (i.e., down time of the EB guns) by at least 20 hours when melting and forming commercial ingots weighing between about 15,000 to about 40,000 pounds. That is, the EB gun assembly with the skeleton frame reduces the complexity and time between melting campaigns.

The skeleton frame enables furnace operators to leave a chamber lid coupled to a chamber while venting the furnace, thereby reducing the introduction of furnace by-products (ash, dust, smoke, among others) into the melt shop during venting. The reduction of by-products introduced into the melt shop improves efficiency as melt shop equipment service life is improved since fewer furnace by-products interact with the manufacturing equipment. The skeleton frame also enables chamber lid cleaning, inspecting, and/or repairing to be performed outside of the furnace station (i.e., where melting of the ingot material occurs), thereby providing more room and easier access to the lid, and improving efficiency, productivity, and safety. Moreover, refurbishing activities do not impact the EB guns which increases EB gun reliability while reducing EB gun maintenance.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. An electron beam (EB) gun assembly for an EB furnace, the EB gun assembly comprising:
   a skeleton frame for mounting; and
   at least one EB gun mounted to the skeleton frame,
   wherein the EB gun-frame assembly is configured to rigidly mount onto a first EB chamber lid of a first EB chamber and be removed from the first chamber lid and rigidly mounted onto a second EB chamber lid of a second EB chamber,
   the skeleton frame having an outer ring and a plurality of cross members defining at least one EB gun opening to expose an EB gun aperture when the skeleton frame is mounted onto and outside the first EB chamber lid or the second EB chamber lid.

2. The EB gun assembly according to claim 1, wherein the at least one EB gun extends through the at least one EB gun opening.

3. The EB gun assembly according to claim 1 further comprising at least one mounting frame, wherein the at least one EB gun is mounted to the at least one mounting frame and the at least one mounting frame is mounted to the skeleton frame.

4. The EB gun assembly according to claim 3, wherein the at least one mounting frame comprises a nozzle opening and the at least one EB gun comprises a nozzle extending through the nozzle opening.

5. The EB gun assembly according to claim 4, wherein the mounting frame comprises a top plate having the nozzle opening and a floating plate movably attached to the top plate, wherein the nozzle of the at least one EB gun is mounted to the floating plate such that a position of the nozzle is movable after the EB gun-frame assembly is rigidly mounted to the first EB chamber lid and the second EB chamber lid.

6. The EB gun assembly according to claim 5 further comprising a collar rigidly attached to the nozzle of the EB gun and movably attached to the top plate of the mounting frame such that the position of the nozzle is movable after the EB gun-frame assembly is rigidly mounted to the first and second EB chamber lids.

7. The EB gun assembly according to claim 6 further comprising a plurality of biasing members between the collar and the top plate such that the collar is movable after the EB gun-frame assembly is rigidly mounted to the first and second EB chamber lids.

8. The EB gun assembly according to claim 1 further comprising a first alignment guide configured to receive a second alignment pin extending from at least one of the first EB chamber lid and the second EB chamber lid such that the at least one EB gun is aligned with a lid gun aperture.

9. The EB gun assembly according to claim 1, wherein the at least one EB gun is a plurality of EB guns mounted to the skeleton frame.

10. The EB gun assembly according to claim 9 further comprising a plurality of mounting frames, wherein each of the plurality of EB guns is mounted to a mounting frame and each of the plurality of mounting frames is mounted to the skeleton frame.

11. The EB gun assembly according to claim 10, wherein each of the plurality of mounting frames comprises a nozzle opening and each of the plurality of EB guns comprises a nozzle extending through the nozzle opening of a mounting frame.

12. The EB gun assembly according to claim 11, wherein each of the plurality of mounting frames comprises a top plate having the nozzle opening and a floating plate movably attached to the top plate, wherein the nozzle of the each of the plurality of EB guns is mounted to the floating plate of one of the mounting frames of the plurality of mounting frames such that a position of the nozzle of each of the plurality of EB guns is movable after the EB gun-frame assembly is rigidly mounted to the first and second EB chamber lids.

13. The EB gun assembly according to claim 12, wherein each of the plurality of mounting frames comprises a collar rigidly attached to the nozzle of one of the plurality of EB guns and movably attached to the top plate of the mounting frame such that the position of the nozzle of each of the plurality of EB guns is movable after the EB gun-frame assembly is rigidly mounted to the first and second EB chamber lids.

14. The EB gun assembly according to claim 13 further comprising a plurality of biasing members between each collar and a top plate such that each collar is movable after the EB gun-frame assembly is rigidly mounted to the first and second EB chamber lids.

15. The EB gun assembly according to claim 1, wherein the at least one EB gun is a plurality of EB guns mounted to the skeleton frame and further comprising a plurality of mounting frames, wherein:
each of the plurality of mounting frames comprises a top plate having a nozzle opening and a floating plate movably attached to the top plate;
the nozzle of each of the plurality of EB guns is mounted to a floating plate and extends through a nozzle opening of a top plate such that a position of each nozzle of the plurality of EB guns is movable; and
each nozzle of the plurality of EB guns is securely mountable to a gun aperture in the first and second EB chamber lids after the EB gun-frame assembly is rigidly mounted to the first and second EB chamber lids, respectively, such that the EB gun-frame assembly is interchangeable with the first and second EB chamber lids.

16. An electron beam (EB) furnace assembly comprising:
a first EB furnace comprising a first EB chamber and a first EB chamber lid having a first set of EB gun apertures;
a second EB furnace comprising a second EB chamber and a second EB chamber lid having a second set of EB gun apertures; and
an EB gun-frame assembly comprising:
a skeleton frame for mounting and a plurality of EB guns mounted to the skeleton frame, the skeleton frame having an outer ring and a plurality of cross members defining a plurality of EB gun openings to expose the first set of EB gun apertures or the second set of gun apertures when the skeleton frame is mounted onto and outside the first EB chamber lid or the second EB chamber lid,
wherein the EB gun-frame assembly is configured to rigidly mount onto the first EB chamber lid with the plurality of EB guns mounted onto the first set of EB gun apertures and be removed from the first chamber lid and rigidly mount onto the second EB chamber lid with the plurality of EB guns mounted onto the second set of EB gun apertures such that the EB gun-frame assembly is interchangeable with the first and second EB chamber lids.

17. The EB furnace assembly according to claim 16 further comprising a plurality of mounting frames, wherein the plurality of EB guns are securely mounted to the plurality of mounting frames and the plurality of mounting frames are securely mounted to the skeleton frame.

18. The EB furnace assembly according to claim 17, wherein each of the plurality of mounting frames has a top plate and a floating plate movable mounted to the top plate, wherein each of the plurality of EB guns is rigidly mounted to a floating plate such that a nozzle of the each of the plurality of EB guns is mounted to the floating plate of a mounting frame such that a position of each of the plurality of EB guns is movable after the EB gun-frame assembly is rigidly mounted to the first and second EB chamber lids.

19. A method of melting material with an electron gun (EB) furnace assembly, the method comprising:
securely mounting an EB gun-frame assembly to a first EB chamber lid, the EB gun-frame assembly comprising a skeleton frame and a plurality of EB guns securely mounted to the skeleton frame, the skeleton frame having an outer ring and a plurality of cross members defining a plurality of EB gun openings,
wherein the first EB chamber lid comprises a first set of EB gun apertures and the plurality of EB guns are mounted onto the first set of EB gun apertures through the plurality of EB gun openings;
melting material in a first EB chamber using the plurality of EB guns, wherein the first EB chamber lid and the EB gun-frame assembly are securely mounted to the first EB chamber;

removing the EB gun-frame assembly from the first EB chamber lid and securely mounting the EB gun-frame assembly to a second EB chamber lid, wherein the second EB chamber lid comprises a second set of EB gun apertures and the plurality of EB guns are mounted onto the second set of EB gun apertures through the plurality of EB gun; and melting material in a second EB chamber using the plurality of EB guns, wherein the second EB chamber lid and the EB gun-frame assembly are securely mounted to the second EB chamber.

20. The method according to claim 19, wherein:

the EB gun-frame assembly further comprises a plurality of mounting frames securely mounted to the skeleton frame and the plurality of EB guns securely mounted to the plurality of mounting frames;

each of the plurality of mounting frames has a top plate and a floating plate movable mounted to the top plate; and each of the plurality of EB guns is rigidly mounted to a floating plate such that a position of each of the plurality of EB guns is movable after the EB gun-frame assembly is rigidly mounted to the first and second EB chamber lids.

* * * * *